(12) United States Patent
Trochut et al.

(10) Patent No.: US 10,587,131 B2
(45) Date of Patent: Mar. 10, 2020

(54) SYSTEM FOR MEASURING THE POWER LEVEL OF AN AMBIENT ENERGY SOURCE

(71) Applicants: Commissariat à l'Energie Atomique et aux Energies Alternatives, Paris (FR); STMicroelectronics (Crolles 2) SAS, Crolles (FR); STMicroelectronics SA, Montrouge (FR)

(72) Inventors: Séverin Trochut, Gilly sur Isere (FR); Stéphane Monfray, Eybens (FR); Sébastien Boisseau, Echirolles (FR)

(73) Assignees: Commissariat à l'Energie Atomique et aux Energies Alternatives, Paris (FR); STMicroelectronics (Crolles 2) SAS, Crolles (FR); STMicroelectronics SA, Montrouge (FR)

( * ) Notice: Subject to any disclaimer, the term of this patent is extended or adjusted under 35 U.S.C. 154(b) by 198 days.

(21) Appl. No.: 15/968,501

(22) Filed: May 1, 2018

(65) Prior Publication Data
US 2018/0331547 A1 Nov. 15, 2018

(30) Foreign Application Priority Data
May 9, 2017 (FR) ...................................... 17 54047

(51) Int. Cl.
*H02J 7/00* (2006.01)
*G01R 31/3835* (2019.01)
(Continued)

(52) U.S. Cl.
CPC ............ *H02J 7/0029* (2013.01); *G01D 21/00* (2013.01); *G01R 31/3835* (2019.01); *H02J 1/06* (2013.01);
(Continued)

(58) Field of Classification Search
USPC ........................................................ 320/101
See application file for complete search history.

(56) References Cited

U.S. PATENT DOCUMENTS

| | | | |
|---|---|---|---|
| 2010/0100149 A1 | 4/2010 | Wotherspoon | |
| 2011/0241625 A1* | 10/2011 | LoCascio | H02J 7/0052 320/140 |

(Continued)

FOREIGN PATENT DOCUMENTS

EP        3035530 A1    6/2016

OTHER PUBLICATIONS

Preliminary Search Report in French Patent Application No. 1754047 dated Jan. 9, 2018, 2 pages.

*Primary Examiner* — Robert Grant
(74) *Attorney, Agent, or Firm* — Moreno IP Law LLC

(57) ABSTRACT

The invention concerns a measurement unit including: an electric ambient energy recovery generator; an element of capacitive storage of the electric energy generated by the generator; an electric battery; a first branch coupling an output node of the generator to a first electrode of the capacitive storage element; a second branch coupling a first terminal of the battery to the first electrode of the capacitive storage element; and an active circuit capable of transmitting a radio event indicator signal each time the voltage across the capacitive storage element exceeds a first threshold, wherein, in operation, the capacitive storage element simultaneously receives a first charge current originating from the generator via the first branch and a second charge current originating from the battery via the second branch.

15 Claims, 4 Drawing Sheets

(51) Int. Cl.
*H02J 7/35* (2006.01)
*H02J 7/34* (2006.01)
*H02J 1/10* (2006.01)
*H02J 1/06* (2006.01)
*G01D 21/00* (2006.01)

(52) U.S. Cl.
CPC ............ *H02J 1/108* (2013.01); *H02J 7/0026* (2013.01); *H02J 7/0047* (2013.01); *H02J 7/0068* (2013.01); *H02J 7/345* (2013.01); *H02J 7/35* (2013.01); *H02J 2007/004* (2013.01); *H02J 2007/005* (2013.01); *H02J 2007/0037* (2013.01); *H02J 2007/0039* (2013.01)

(56) References Cited

U.S. PATENT DOCUMENTS

| | | | |
|---|---|---|---|
| 2012/0187897 A1* | 7/2012 | Lenk | H01M 10/44 320/101 |
| 2012/0261991 A1 | 10/2012 | Tatar et al. | |
| 2015/0128733 A1 | 5/2015 | Taylor et al. | |

\* cited by examiner

SYSTEM FOR MEASURING THE POWER LEVEL OF AN AMBIENT ENERGY SOURCE

This application claims the priority benefit of French patent application number 17/54047, the content of which is hereby incorporated by reference in its entirety to the maximum extent allowable by law.

BACKGROUND

The present disclosure concerns management or monitoring systems based on wireless measurement units. It more particularly aims at a system for measuring the power level of an ambient energy source comprising one or a plurality of wireless measurement units.

DISCUSSION OF THE RELATED ART

Systems comprising one or a plurality of measurement units have already been provided, each unit comprising at least one sensor of a parameter to be measured, for example, a temperature sensor, a pressure sensor, a luminosity sensor, an acceleration sensor, a magnetic field sensor, etc. and further comprising a radio communication circuit capable of transmitting, to a receive unit or data collection unit of the system, data measured by its parameter sensor(s). Each unit comprises its own electric power source, which may be a battery, or also an ambient energy recovery generator.

A problem which is posed in such systems is that of the autonomy of the measurement units. Indeed, in the case of units powered by the battery, when the battery is discharged, the unit may no longer operate and a maintenance operation should be provided to recharge or replace the battery. In the case of units integrating an ambient energy recovery generator, the autonomy of the unit is potentially infinite, but the unit can only operate when the generator receives enough ambient energy. For example, in the case of a unit powered by a photoelectric generator, the unit can only operate when the ambient luminosity is sufficiently high to power the sensors and the communication circuit of the unit.

To overcome such disadvantages, the applicants have provided in French patent application no. 16/59698, filed on Oct. 7, 2016, a measurement system comprising one or a plurality of measurement units and a data collection unit. In this system, each measurement unit comprises an active circuit capable of communicating by radio link with the data collection unit. Each measurement unit further comprises an ambient energy recovery electric generator capable of converting into electricity ambient energy present in the environment of the measurement unit. Each unit further comprises a capacitive storage element, for example, a capacitor, capable of storing the electric power generated by the generator. In each measurement unit, the active circuit of the unit draws its electric supply power from the capacitive storage element of the unit. Each measurement unit is configured to transmit, via its active circuit, a radio event indicator signal, for example, a predefined pulse or frame, intended for the data collection unit, each time the voltage across its capacitive storage element exceeds a threshold. The data collection unit of the system is capable of measuring a time quantity representative of the frequency of transmission of the event indicator signals by each measurement unit, for example, the period separating the times of reception of two successive event indicator signals originating from a same measurement unit, or the number of successive event indicator signal received from a same measurement unit within a predetermined time interval. Knowing the characteristics of the unit, and particularly the power efficiency of its ambient energy recovery generator and the electric power consumption of its active circuit, the data collection unit can deduce, from this time quantity, information relative to the power level of the ambient energy source powering the unit. Thus, the data collection unit is capable of deducing, from a measurement representative of the frequency of transmission of the event indicator signals by a measurement unit, a parameter relative to the environment of the measurement unit.

An advantage of such a system is the practically unlimited autonomy of the measurement unit(s) of the system. Indeed, as long as the ambient energy source used by the measurement unit(s) is sufficiently powerful to charge the capacitive storage element of the unit, the information relative to the power of the ambient energy source, coded in the form of a time quantity, is transmitted to the data collection unit. If the power of the ambient energy source becomes too low to charge the capacitor of the unit, the data collection unit no longer receives event indicator signals from the unit, and can deduce therefrom that the power level of the ambient energy source powering the unit is lower than a threshold corresponding to the minimum sensitivity threshold of the system.

It would however be desirable to at least partly improve certain aspects of the system described in above-mentioned French patent application no. 16/59698. In particular, a limitation of this system is that when the data collection unit receives no event indicator signal from a radio unit during a determined time period, it cannot determine whether this absence of a signal results from a low or zero power level of the ambient energy source, or from a failure of the unit.

SUMMARY

Thus, an embodiment provides a measurement unit comprising: an electric ambient energy recovery generator; an element of capacitive storage of the electric energy generated by the generator; an electric battery; a first branch coupling an output node of the generator to a first electrode of the capacitive storage element; a second branch coupling a first terminal of the battery to the first electrode of the capacitive storage element; and an active circuit capable of transmitting a radio event indicator signal each time the voltage across the capacitive storage element exceeds a first threshold, wherein, in operation, the capacitive storage element simultaneously receives, on its first electrode, a first charge current originating from the generator via the first branch and a second charge current originating from the battery via the second branch.

According to an embodiment, the first branch comprises a first resistor and the second branch comprises a second resistor.

According to an embodiment, the second branch comprises a circuit for protecting the battery against an over-discharge.

According to an embodiment, the circuit for protecting the battery against an over-discharge comprises a transistor coupling the first terminal of the battery to the first electrode of the capacitive storage element, and a circuit capable of controlling this transistor to the on state when the voltage across the battery is higher than a low limit below which the battery would risk being damaged, and to the off state when the voltage across the battery is lower than said low limit.

According to an embodiment, the first branch comprises a diode oriented in the forward direction between the output node of the generator and the first electrode of the capacitive storage element.

According to an embodiment, the second branch comprises a diode oriented in the forward direction between the first terminal of the battery and the first electrode of the capacitive storage element.

According to an embodiment, the unit further comprises a third branch coupling the output node of the generator to the first terminal of the battery.

According to an embodiment, the third branch comprises a circuit for protecting the battery against an overcharge.

According to an embodiment, the circuit for protecting the battery against an overcharge comprises a transistor coupling the output node of the generator to the first terminal of the battery, and a circuit capable of controlling this transistor to the on state when the voltage across the battery is lower than a high limit above which the battery would risk being damaged, and to the off state when the voltage across the battery is higher than said high limit.

According to an embodiment, the third branch further comprises a circuit for limiting the charge current applied to the battery.

According to an embodiment, the current-limiting circuit comprises a transistor and a circuit capable of controlling this transistor in linear state so that the resistance of the transistor is all the higher as the current applied by the generator in the third branch is high.

According to an embodiment, the third branch further comprises a diode oriented in the forward direction between the output node of the generator and the first terminal of the battery.

According to an embodiment, the active circuit has a power supply node coupled to the first electrode of the capacitive storage element via a switch, and the unit comprises a control circuit capable of controlling the switch to the on state when the voltage across the capacitive element exceeds said first threshold.

According to an embodiment, the control circuit is further capable of controlling the switch back to the off state when the voltage across the capacitive element falls below a second threshold lower than the first threshold.

Another embodiment provides a system comprising one or a plurality of measurement units such as defined hereabove and a data collection unit capable of receiving the event indicator signals transmitted by each unit, and of measuring a time quantity representative of the frequency of transmission of the event indicator signals by each unit.

The foregoing and other features and advantages will be discussed in detail in the following non-limiting description of specific embodiments in connection with the accompanying drawings.

DETAILED DESCRIPTION OF THE PRESENT EMBODIMENTS

Figure 1:
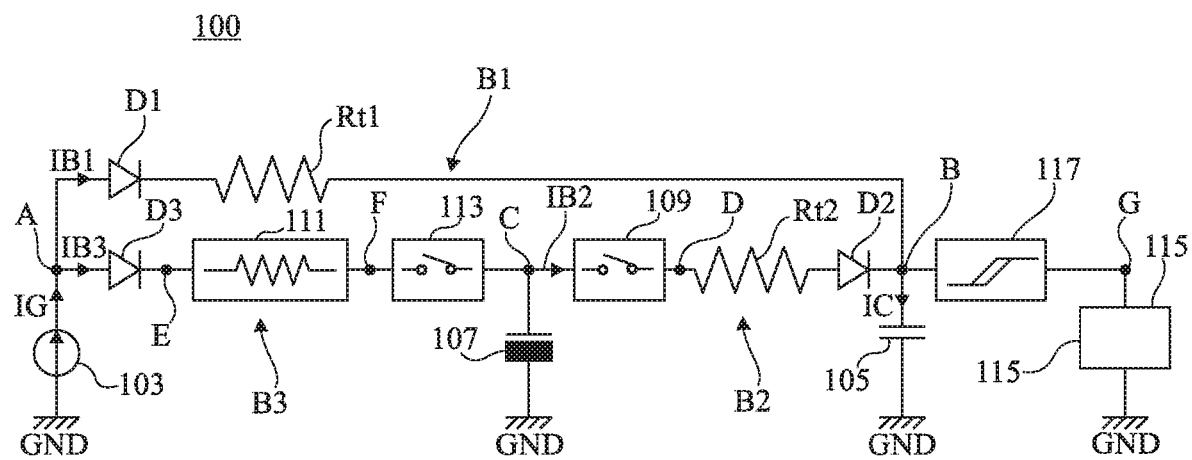
FIG. 1 is a simplified electric diagram of an embodiment of a unit for measuring the power level of an ambient energy source.

The same elements have been designated with the same reference numerals in the various drawings and, further, the various drawings are not to scale. For clarity, only those steps and elements which are useful to the understanding of the described embodiments have been shown and are detailed. In particular, the measurement systems described hereafter comprise one or a plurality of measurement units, and a receive unit also called data collection unit, capable of receiving radio signals transmitted by the measurement units. The manufacturing of the data collection unit has not been detailed, it being within the abilities of those skilled in the art based on the functional indications of the present description. Further, the manufacturing of the radio communication circuits of the measurement units has not been detailed, the described embodiments being compatible with radio communication circuits used in known wireless measurement units. In the present description, term "connected" will be used to designate a direct electric connection, with no intermediate electronic component, for example, by means of a conductive track, and term "coupled" or term "linked" will be used to designate either a direct electric connection (then meaning "connected") or a connection via one or a plurality of intermediate components (resistor, capacitor, etc.). The terms "approximately", "substantially", and "in the order of" are used herein to designate a tolerance of plus or minus 10%, preferably of plus or minus 5%, of the value in question.

According to an aspect of an embodiment, a system for measuring the power level of an ambient energy source similar to that described in above-mentioned French patent application no. 16/59698, but where each measurement unit further comprises an electric battery enabling the unit to keep on sending signals to the data collection unit even when the power level of the ambient energy source powering the ambient energy recovery generator of the unit becomes too low to charge its capacitive storage element, is provided.

More particularly, in the described embodiments, in normal operation, the capacitive storage element of each unit simultaneously receives a first charge current originating from the ambient energy recovery generator of the unit, and a second charge current originating from the battery of the unit. The charge current originating from the battery is substantially constant, while the charge current originating from the generator varies according to the power level of the ambient energy source powering the generator of the unit. The capacitor charge speed, and accordingly the frequency of transmission of the event indicator signals by the unit, thus vary according to the power level of the ambient energy source. More particularly, the higher the power level of the ambient energy source, the higher the frequency of transmission of the event indicator signals by the unit, and conversely. When the power level of the ambient energy source is zero or negligible, the capacitive storage element of the unit then only receives the current originating from the battery. The frequency of transmission of the event indicator signals by the unit is then equal to a minimum value Fmin only depending on the characteristics of the unit.

Thus, by measuring a time quantity representative of the transmit frequency of the event indicator signals transmitted by each measurement unit, for example, the period separating the times of reception of two successive event indicator signals originating from the measurement unit within a predetermined time interval, the data collection unit of the system can determine the power level of the ambient energy source powering the generator of the unit. When the data collection unit receives no event indicator signal for a predetermined period greater than 1/Fmin, it can deduce therefrom that the unit has failed or that its battery is discharged.

FIG. 1 is a simplified electric diagram of an embodiment of a unit 100 for measuring the power level of an ambient energy source.

Measurement unit 100 comprises an ambient energy recovery generator 103 capable of supplying, on anode A of the unit, a current Ig which is a function of the power level of an ambient energy source. In FIG. 1, generator 103 has been shown in the form of a current source coupling a node GND of application of a reference potential of the unit, for example, the ground, to node A. As an example, generator 103 is a luminous energy recovery generator, for example comprising one or a plurality of photovoltaic cells, a mechanical energy recovery generator, a thermal energy recovery generator, or an electromagnetic energy recovery generator. The described embodiments are however not limited to these specific examples.

Measurement unit 100 further comprises a capacitive storage element 105, for example, a capacitor, capable of storing at least part of the electric energy generated by generator 103. In this example, capacitive element 105 has a first electrode coupled (for example, connected) to a node B of the unit, and a second electrode coupled (for example, connected) to node GND.

Measurement unit 100 further comprises a first branch B1 coupling node A to node B. In this example, branch B1 comprises a resistor Rt1 having a first end coupled to node A and a second end coupled to node B. In the example of FIG. 1, branch B1 further comprises a diode D1 series-coupled with resistor Rt1, diode D1 being oriented in the forward direction between nodes A and B, that is, having its anode on the side of node A and its cathode on the side of node B. More particularly, in the shown example, the anode of diode D1 is connected to node A, the cathode of diode D1 is connected to the first end of resistor Rt1, and the second end of resistor Rt1 is connected to node B.

Measurement unit 100 further comprises an electric battery 107 having a positive terminal coupled (for example, connected) to a node C of the unit, and a negative terminal coupled (for example, connected) to node GND. Battery 107 is for example a lithium-ion battery, for example, a solid electrolyte thin-film battery. More generally, any other type of electrochemical accumulator may be used.

Measurement unit 100 further comprises a second branch B2 coupling node C to node B. In this example, branch B2 comprises a resistor Rt2 having a first end coupled to node C and a second end coupled to node B. In the example of FIG. 1, branch B2 further comprises a diode D2 series-coupled with resistor Rt2, diode D2 being oriented in the forward direction between nodes C and B. In this example, branch B2 further comprises a circuit 109 for protecting battery 107 against an over-discharge, that is, a circuit capable of interrupting the discharge of battery 107 into capacitive storage element 105 when the voltage of battery 107 reaches a low threshold below which the battery would risk being damaged. In the shown example, circuit 109 has a first node connected to node C and a second node connected to a node D of the unit, the first end of resistor Rt2 being connected to node D, the second end of resistor Rt2 being connected to the anode of diode D2, and the cathode of diode D2 being connected to node B.

Measurement unit 100 further comprises a third branch B3 coupling node A to node C. In this example, branch B3 comprises a circuit 111 for limiting the recharge current applied to battery 107 by generator 103, and a circuit 113 for protecting battery 107 against an overcharge, that is, a circuit capable of interrupting the recharge current applied to battery 107 by generator 103 when the voltage of battery 107 reaches a high threshold beyond which the battery would risk being damaged. In this example, branch B3 further comprises a diode D3 oriented in the forward direction between nodes A and C. More particularly, in the shown example, diode D3 has its anode connected to node A and its cathode connected to a node E of the unit, circuit 111 has a first node connected to node E and a second node connected to a node F of the unit, and circuit 113 has a first node connected to node F and a second node connected to node C.

Measurement unit 100 further comprises an active circuit 115 capable of communicating by radio link with the data collection unit (not shown in FIG. 1) of the system. As an example, active circuit 115 comprises a radio transmission unit (not shown) capable of communicating with the data collection unit, for example, according to a radio communication standard of Bluetooth or IEEE 802.15.4 type, or according to any other adapted wireless radio communication technology. Active circuit 115 may further comprise a control unit (not shown), for example, a microcontroller, capable of controlling the radio unit. Active circuit 115 comprises first and second power supply nodes, the first power supply node being coupled (for example, connected) to node GND and the second power supply node being coupled (for example, connected) to a node G of the unit.

Measurement unit 100 further comprises a circuit 117 for comparing a voltage with a threshold comprising a first node coupled (for example, connected) to node B, a second node coupled (for example, connected) to node G, and a third node (not shown in FIG. 1) coupled (for example, connected) to node GND. Circuit 117 is capable of comparing the voltage between nodes B and GND, that is, the voltage across capacitive storage element 105, with a predefined threshold VH, and, when this voltage is greater than threshold VH, of coupling node G to node B to apply to circuit 115 a power supply voltage supplied by capacitive storage element 105. More particularly, circuit 117 comprises a hysteresis comparator capable of controlling a switch coupling node B to node G to the on state when the voltage across element 105 rises above threshold VH, and then of controlling the switch back to the off state, to isolated node G from node B, only when the voltage across element 105 falls below a threshold VL smaller than threshold VH.

The operation of unit 100 of FIG. 1 will now be described.

First, an operating mode where circuits 111, 113, and 109 behave as on switches is considered. In other words, it is considered that nodes E, F, C, and D of unit 100 are connected.

Ambient energy recovery generator 103 of the unit supplies a current IG which is all the higher as the power level of the ambient energy source powering the unit is high. A first portion IB1 of current IG directly charges capacitive storage element 105 through branch B1, and a second portion IB3 (substantially equal to IG-IB1 in this example) of current IG flows through branch B3 towards node C, and particularly charges battery 107. The total charge current IC received by capacitive storage element 105 is the sum of current IB1 and of a current IB2 originating from branch B2. Current IB2 at least partly originates from battery 107 and possibly, for another portion, directly from branch B3.

Thus, although capacitive storage element 105 permanently receives a charge current from battery 107, this current only amounts to a portion of total charge current IC of element 105, the other portion of current IC directly originating (that is, without passing through battery 107) from generator 103. The charge speed of element 105 thus is a function of the power level of the ambient energy source powering the unit. When the voltage across capacitive storage element 105 rises above threshold VH, comparison circuit 117 couples node B to node G. Active circuit 115 is then powered by capacitive storage element 105. Active circuit 115 is configured to transmit, when it receives a power supply voltage after an idle period, an event indicator radio signal to the data collection unit. The electric energy consumed by active circuit 115 during this phase causes the discharge of capacitive storage element 105 down to low threshold VL of circuit 117. Circuit 117 then isolates node G from node B, so that active circuit 115 stops being powered. The charge of capacitive storage element 105 is then resumed until the next switching of comparison circuit 117.

The distribution between the portion of the electric energy received by capacitive storage element 105 directly from ambient energy recovery generator 103 and the portion of the electric energy received by capacitive storage element 105 from battery 107 is determined, in particular, by the values of resistors Rt1 and Rt2. It will be within the abilities of those skilled in the art to adjust this distribution according to the needs of considered application. Preferably, resistance Rt2 is much larger than resistance Rt1, for example at least ten times larger than resistance Rt1, so that, for an average power level of the ambient energy source, the portion of the electric energy received by capacitive storage element 105 directly from generator 103 is preponderating over the portion of the electric energy received by capacitive storage element 105 from battery 107. As an example, resistance Rt2 is selected so that, when the power level of the ambient energy source powering the unit is zero or negligible and when battery 107 is charged, the charge speed of capacitive storage element 105 is such that period Tmax=1/Fmin between two successive transmissions of an event indicator signal by active circuit 115 is greater than or equal to 1 min, for example, greater than or equal to 10 min, for example, greater than or equal to 30 min. Preferably, when the power level of the ambient energy source powering the unit is average, that is, equal to half the maximum power that can be delivered by the ambient energy source, and when battery 107 is charged, the period between two successive transmissions of an event indicator signal by active circuit 115 is at least 10 times smaller and preferably at least 100 times smaller than period Tmax, for example, smaller than or equal to 10 seconds, for example, smaller than or equal to 5 seconds.

In the example of FIG. 1, diodes D1, D2, and D3 particularly enable to avoid a discharge of battery 107 into capacitive storage element 105 through branches B3 and B1 or a discharge of capacitive storage element 105 in battery 107 through branch B2 or through branches B1 and B3 or also a discharge of capacitive storage element 105 or of battery 107 into the generator.

Circuit 109 of the unit of FIG. 1 has the function of protecting battery 107 against an over-discharge, which might for example occur if the power level of the ambient energy source powering the unit remains zero or negligible for a long period, causing a complete discharge of the battery in capacitive storage element 105. Circuit 109 is capable of interrupting the current flow in branch B2 when the voltage of the battery reaches a predefined low limit below which the battery would risk being damaged.

Circuit 113 of the unit of FIG. 1 has the function of protecting battery 107 against an overcharge, which might for example occur if the power level of the ambient energy source powering the unit remained abnormally high for a long period. Circuit 113 is capable of interrupting the current flow in branch B3 when the battery voltage reaches a predefined high limit above which the battery would risk being damaged.

Circuit 111 of the unit of FIG. 1 has the function of limiting the intensity of the recharge current applied to battery 107, particularly to avoid a degradation of the battery in the case where the power level of the ambient energy source powering the unit would be particularly high. It should be noted that current-limiting circuit 111 behaves as a resistor and thus also influences, with resistors Rt1 and Rt2, the distribution of current IG generated by generator 103 between branches B1 and B3 of the unit.

Embodiments of protection circuits 109 and 113 and of current-limiting circuit 111 will be described hereafter in relation with FIGS. 3 to 8. It should however be noted that circuits 109, 111, and 113 are optional. As a variation, all or some of these circuits may be omitted, in which case node E may be connected to node F and/or node F may be connected to node C, and/or node C may be connected to node D.

Figure 2:
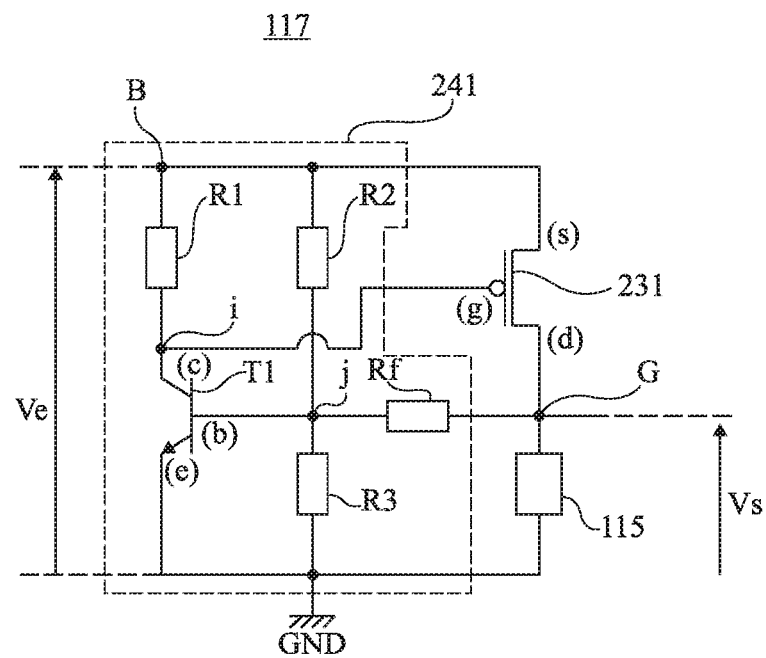
FIG. 2 is an electric diagram illustrating in further detail an alternative embodiment of a circuit for comparing a voltage with a threshold of the unit of FIG. 1.

FIG. 2 is an electric diagram illustrating in further detail an embodiment of circuit 117 of measurement unit 100 of FIG. 1. In FIG. 2, only circuit 117 and active circuit 115 of the unit have been shown.

Circuit 117 comprises a switch 231 coupling node B to node G, as well as a circuit 241 for controlling switch 231.

Control circuit 241 of FIG. 2 comprises a first branch comprising a resistor R1 and a transistor T1 in series between input nodes B and GND of circuit 117. In FIG. 2, reference Ve designates the input voltage applied between nodes B and GND, corresponding to the voltage across capacitive storage element 105 (not shown in FIG. 2) of the unit. In the shown example, resistor R1 has a first end coupled to node B and a second end coupled to an output node i of control circuit 241, and transistor T1 has a first conduction node coupled to node i and a second conduction node coupled to node GND. In the shown example, transistor T1 is an NPN-type bipolar transistor, having its collector (c) coupled to node i and having its emitter (e) coupled to node GND.

Circuit 241 of FIG. 2 further comprises a second branch parallel to the first branch, comprising two resistors R2 and R3 in series between nodes B and GND. More particularly, in the shown example, resistor R2 has a first end coupled to node B and a second end coupled to a node j, and resistor R3 has a first end coupled to node j and a second end coupled to node GND. Resistors R2 and R3 form a voltage-dividing bridge. Node j, or midpoint of the dividing bridge, is coupled to a control node of transistor T1, that is, the base (b) of transistor T1 in the shown example.

Circuit 241 further comprises a resistor Rf having a first end coupled to node j and a second end coupled to power supply node G of active circuit 115.

In the example of FIG. 2, switch 231 is a transistor having a first conduction node coupled to node B, a second conduction node coupled to node G, and a control node coupled to node i. In the shown example, transistor 231 is a P-channel MOS transistor having its source (s) coupled to node B, having its drain (d) coupled to node G, and having its gate (g) coupled to node i.

Nodes G and GND are nodes for supplying an output voltage Vs of circuit 117, corresponding to the power supply voltage of active circuit 115 of the unit.

The circuit of FIG. 2 operates as follows. When input voltage Ve is low, the voltage across resistor R3 of the dividing bridge is not sufficient to turn on transistor T1. Transistor T1 is thus off. The voltage across resistor R1, corresponding to the gate-source voltage of transistor 231 in this example, is then substantially zero. Transistor 231 is thus off. The current flowing through the load formed by active circuit 115 is then substantially zero, and circuit 115 is not powered. Output voltage Vs is then approximately zero.

Resistive element Rf then takes part in lowering the voltage of node j by drawing it towards that of node G (then substantially equal to that of node GND) and thus reinforces the blocking of transistor T1.

When voltage Ve increases beyond a threshold VH, the voltage across resistor R3 reaches the turn-on threshold of transistor T1. Transistor T1 then turns on and a current flows through the branch comprising resistor R1 and transistor T1. The voltage across resistor R1, or source-gate voltage of transistor 231 in this example, then increase up to the turn-on threshold of transistor 231. Transistor 231 thus also turns on. The load formed by active circuit 115 is then powered, and output voltage Vs of circuit 100 becomes substantially equal to input voltage Ve (to within the voltage drop of transistor 231).

Resistive element Rf then tends to increase the voltage of node j by drawing it towards that of node G (then substantially equal to that of node B) and thus contributes to maintaining the conductive state of transistor T1.

When voltage Ve falls back under a threshold VL lower than threshold VH, the voltage across resistor R3 is no longer sufficient to maintain transistor T1 in the on state. Transistor T1 thus blocks, and the voltage across resistor R1 becomes substantially zero, causing the blocking of transistor 231. As a result, active circuit 115 is no longer powered, and voltage Vs becomes substantially zero.

As a variation, resistive element Rf may be replaced with a capacitive element, or with a series or parallel association of a resistive element and of a capacitive element.

It should be noted that a circuit for comparing a voltage with a threshold similar to that of FIG. 2 is described in European patent application EP3035530, as well as in the corresponding US patent application US201617289.

The described embodiments are not limited to the embodiment of circuit 117 described in relation with FIG. 2. As a variation, circuit 117 of FIG. 2 may be replaced with any other circuit comprising a switch coupling nodes B and G of the unit, and a control circuit capable of comparing the voltage across capacitive storage element 105 with a threshold and of controlling the switch to the on state when the voltage across element 105 exceeds this threshold. In particular, the described embodiments are compatible with the various alternative embodiments of the circuit of FIG. 2 described in above-mentioned patent applications EP3035530 and US201617289, which are incorporated herein by reference.

Figure 3:
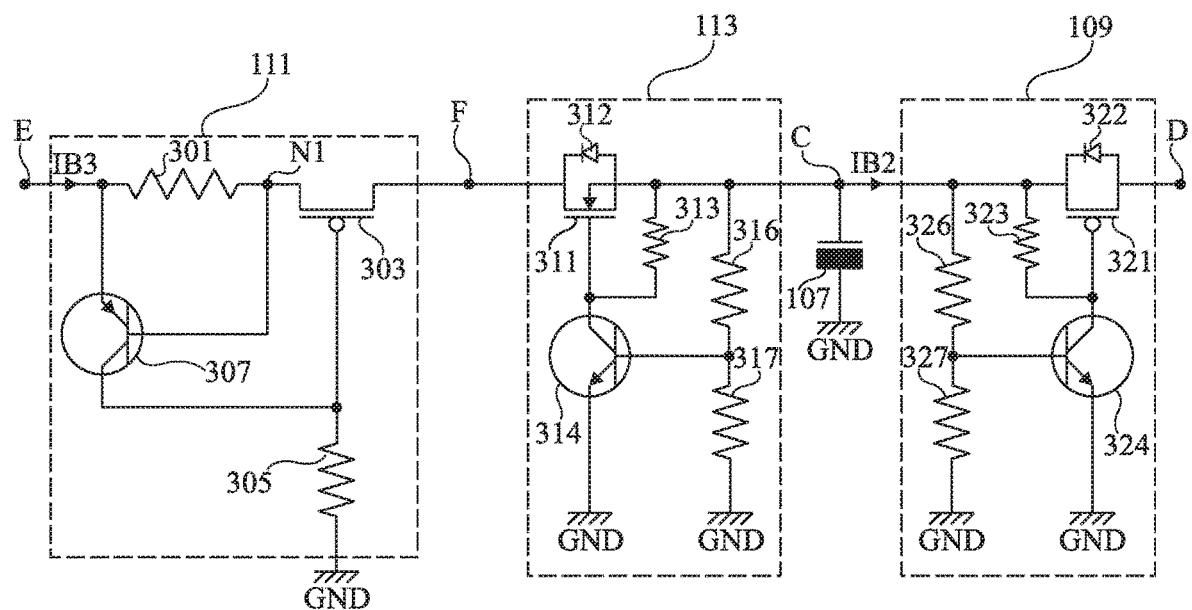
FIG. 3 is an electric diagram illustrating in further detail an embodiment of a current-limiting circuit, of a circuit of protection against an overcharge, and of a circuit of protection against an over-discharge, of the unit of FIG. 1.

FIG. 3 is an electric diagram illustrating in further detail an embodiment of branches B2 and B3 of measurement unit 100 of FIG. 1. FIG. 3 more particularly illustrates an embodiment of circuits 109, 111, and 113 of the unit of FIG. 1. FIG. 3 only shows circuits 109, 111, and 113 and battery 107.

In this example, current-limiting circuit 111 comprises a resistor 301 in series with a MOS transistor 303 between nodes E and F of the circuit. More particularly, in the shown example, resistor 301 has a first end connected to node E and a second end connected to an intermediate node N1, and transistor 303 has a first conduction node connected to node N1 and a second conduction node connected to node F. In the shown example, transistor 303 is a P-channel MOS transistor. Circuit 111 of FIG. 3 further comprises a resistor 305 coupling the gate of transistor 303 to node GND. More particularly, in the shown example, resistor 305 has a first end connected to the gate of transistor 303 and a second end connected to node GND. Circuit 111 of FIG. 3 further comprises a bipolar transistor 307 having its conduction nodes respectively coupled to node E and to the gate of transistor 303, and having its base coupled to node N1. In the shown example, transistor 307 is a PNP transistor having its emitter connected to node E, having its collector connected to the gate of transistor 303, and having its base connected to node N1.

Circuit 111 of FIG. 3 operates as follows. When current IB3 originating from generator 103 of the unit is zero, the voltage across resistor 301 is zero, and no current flows through the base-emitter junction of transistor 307. Transistor 307 is thus off, and the potential applied to the gate of transistor 303 is substantially equal to the potential of node GND. Transistor 303 is thus conductive. When current IB3 originating from generator 103 increases, the voltage across resistor 301 increases, which results in forward-biasing the emitter-base junction of transistor 307. When transistor 307 starts conducting, the potential applied to the gate of transistor 303 tends to rise, which limits the current flowing between nodes E and F. Thus, transistor 303 behaves as a variable resistor, controlled by the circuit formed by resistors 301 and 305 and transistor 307 to have a value which is all the higher as current IB3 originating from generator 103 is high.

In the example of FIG. 3, circuit 113 comprises a depletion MOS transistor 311 having a first conduction node coupled to node F and having a second conduction node coupled to node C. As an example, transistor 311 is an N-type transistor having its drain connected to node F and having its source connected to node C. In the example of FIG. 3, circuit 113 further comprises a diode 312, for example corresponding to the intrinsic source-drain diode of transistor 311, having its anode connected to node C and having its cathode connected to node F. Circuit 113 of FIG. 3 further comprises a resistor 313 coupling the source and the gate of transistor 311, and a bipolar transistor 314 having its conduction nodes respectively coupled to the gate of transistor 311 and to node GND. More particularly, in the shown example, transistor 314 is an NPN transistor having its emitter connected to node GND and having its collector connected to the gate of transistor 311, resistor 313 having a first end connected to the gate of transistor 311 and a second end connected to the source of transistor 311. Circuit 113 of FIG. 3 further comprises a resistive voltage dividing bridge comprising two resistors 316 and 317 in series between node C and node GND, the junction point of resistors 316 and 317 being coupled to the base of transistor 314. More particularly, in the shown example, resistor 316 has a first end connected to node C and a second end connected to the base of transistor 314, and resistor 317 has a first end connected to the base of transistor 314 and a second end connected to node GND.

Circuit 113 of FIG. 3 operates as follows. In the absence of a battery overcharge, transistor 314 is maintained off by the voltage dividing bridge formed by resistors 316 and 317. Transistor 311 is thus on, and conducts the current originating from generator 103 from node F to node C. The voltage dividing bridge formed by resistors 316 and 317 is sized so that transistor 314 turns on when the voltage between nodes C and GND reaches a threshold corresponding to the high voltage limit above which the battery risks being damaged. When transistor 314 turns on, the gate of transistor 311 is set to a potential substantially equal to the potential of node GND, which results in turning off transistor 311. Current IB3 originating from generator 103 of the unit is then interrupted and stops powering battery 107.

In the example of FIG. 3, circuit 109 comprises a MOS transistor 321 having a first conduction node coupled to node C and having a second conduction node coupled to node D. As an example, transistor 321 is a P-channel transistor having its drain connected to node D and having its source connected to node C. In the example of FIG. 3, circuit 109 further comprises a diode 322, for example corresponding to the intrinsic drain-source diode of transistor 321, having its anode connected to node D and having its cathode connected to node C. Circuit 109 of FIG. 3 further comprises a resistor 323 coupling the source and the gate of transistor 321 and a bipolar transistor 324 having its conduction nodes respectively coupled to the gate of transistor 321 and to node GND. More particularly, in the shown example, transistor 324 is an NPN transistor having its emitter connected to node GND and having its collector connected to the gate of transistor 321, and resistor 323 has a first end connected to the gate of transistor 321 and a second end connected to the source of transistor 321. Circuit 109 of FIG. 3 further comprises a resistive voltage dividing bridge comprising two resistors 326 and 327 in series between node C and node GND, the junction point of resistors 326 and 327 being coupled to the base of transistor 324. More particularly, in the shown example, resistor 326 has a first end connected to node C and a second end connected to the base of transistor 324, and resistor 327 has a first end connected to the base of transistor 324 and a second end connected to node GND.

Circuit 109 of FIG. 3 operates as follows. When the battery is normally charged, transistor 324 is maintained on by the voltage dividing bridge formed by resistors 326 and 327. Transistor 321 is thus on, and conducts current IB2 between nodes C and D of branch B2. The voltage dividing bridge formed by resistors 326 and 327 is sized so that transistor 324 turns off when the voltage between nodes C and GND reaches a threshold corresponding to the low voltage limit below which the battery risks being damaged. When transistor 324 turns off, the gate of transistor 321 is set to a potential substantially equal to the potential of node C, which results in turning off transistor 321. Current IB2 flowing between nodes C and D is then interrupted and battery 107 stops discharging.

Figure 4:
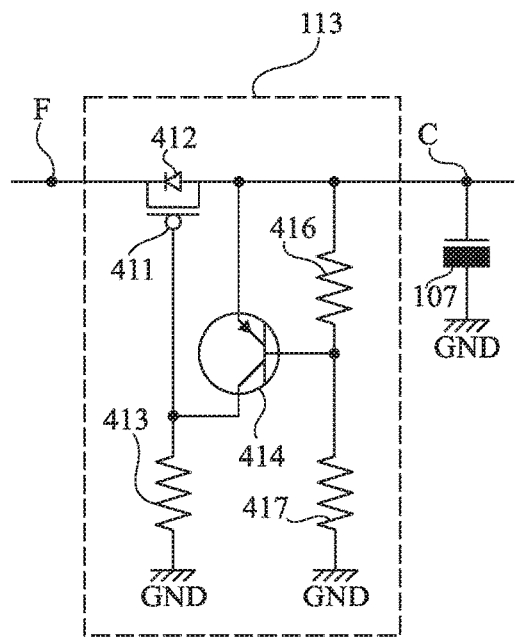
FIG. 4 is an electric diagram illustrating another embodiment of the circuit of protection against an overcharge described in relation with FIG. 3.

FIG. 4 is an electric diagram illustrating another embodiment of circuit 113 of protection against an overcharge described in relation with FIG. 3. In FIG. 4, only circuit 113 and battery 107 have been shown.

In the example of FIG. 4, circuit 113 comprises a P-channel MOS transistor 411 having its source coupled (connected in the shown example) to node C and having its drain coupled (connected in the shown example) to node F. In the example of FIG. 4, circuit 113 further comprises a diode 412, for example, corresponding to the intrinsic source-drain diode of transistor 411, having its anode connected to node C and having its cathode connected to node F. Circuit 113 of FIG. 4 further comprises a resistor 413 coupling the gate of transistor 411 to node GND, and a bipolar transistor 414 having its conduction nodes respectively coupled to node C and to the gate of transistor 411. More particularly, in the shown example, transistor 414 is a PNP transistor having its emitter connected to node C and having its collector connected to the gate of transistor 411, and resistor 413 has a first end connected to the gate of transistor 411 and a second end connected to node GND. Circuit 113 of FIG. 4 further comprises a resistive dividing bridge comprising two resistors 416 and 417 in series between node C and node GND, the junction point of resistors 416 and 417 being coupled to the base of transistor 414. More particularly, in the shown example, resistor 416 has a first end connected to node C and a second end connected to the base of transistor 414, and resistor 417 has a first end connected to the base of transistor 414 and a second end connected to node GND.

Circuit 113 of FIG. 4 operates as follows. In the absence of a battery overcharge, transistor 414 is maintained off by the voltage dividing bridge formed by resistors 416 and 417. Transistor 411 is thus on, and conducts the current originating from generator 103 from node F to node C. The voltage dividing bridge formed by resistors 416 and 417 is sized so that transistor 414 turns on when the voltage between nodes C and GND reaches a threshold corresponding to the high voltage limit above which the battery risks being damaged. When transistor 414 turns on, the gate of transistor 411 is set to a potential substantially equal to the potential of node GND, which results in turning off transistor 411. Current IB3 originating from generator 103 of the unit is then interrupted and stops powering battery 107.

Figure 5:
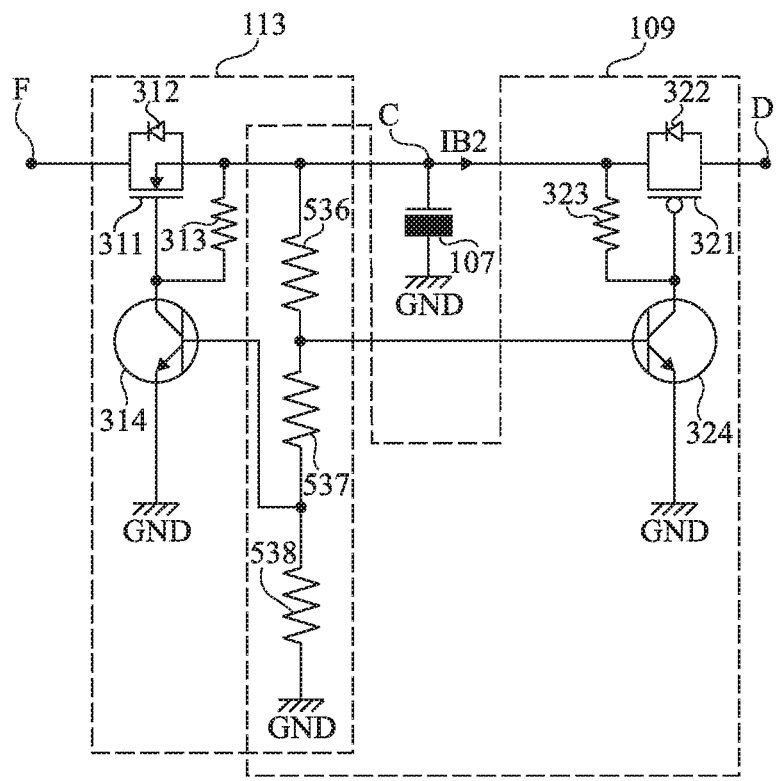
FIG. 5 is an electric diagram illustrating another embodiment of the circuit of protection against an overcharge and of the circuit of protection against an over-discharge described in relation with FIG. 3.

FIG. 5 is an electric diagram illustrating another embodiment of circuit 113 of protection against an overcharge and of circuit 109 of protection against an over-discharge described in relation with FIG. 3. FIG. 5 only shows circuits 113 and 109 and battery 107.

Circuits 113 and 109 of FIG. 5 comprise elements common with circuits 113 and 109 of FIG. 3. In particular, elements 311, 312, 313, 314, 321, 322, 323, and 324 are common to the two drawings and are arranged substantially in the same way in the two drawings. The example of FIG. 5 differs from the example of FIG. 3 mainly in that, in the example of FIG. 5, the voltage dividing bridges of circuits 113 and 109 are mutualized. More particularly, in the example of FIG. 5, the single-output voltage dividing bridge of circuit 113, formed by resistors 316 and 317, and the single-output voltage dividing bridge of circuit 109, formed by resistors 326 and 327, are replaced with a two-output voltage dividing bridge, common to circuits 113 and 109. More particularly, in the example of FIG. 5, the voltage dividing bridge common to circuits 113 and 109 comprises three resistors 536, 537, and 538 in series between nodes C and GND, the junction point of resistors 536 and 537 being coupled to the base of transistor 324, and the junction point of resistors 537 and 538 being coupled to the base of transistor 314. More particularly, in the shown example, transistor 536 has a first end connected to node C and a second end connected to the base of transistor 324, resistor 537 has a first end connected to the base of transistor 324 and a second end connected to the base of transistor 314, and the third resistor has a first end connected to the base of transistor 314 and a second end connected to node GND.

As compared with the example of FIG. 3, an advantage of the example of FIG. 5 is that it enables to spare a resistor, and to decrease the general electric power consumption of circuits 113 and 109 coupled to the control of transistors 314 and 324.

Figure 6:
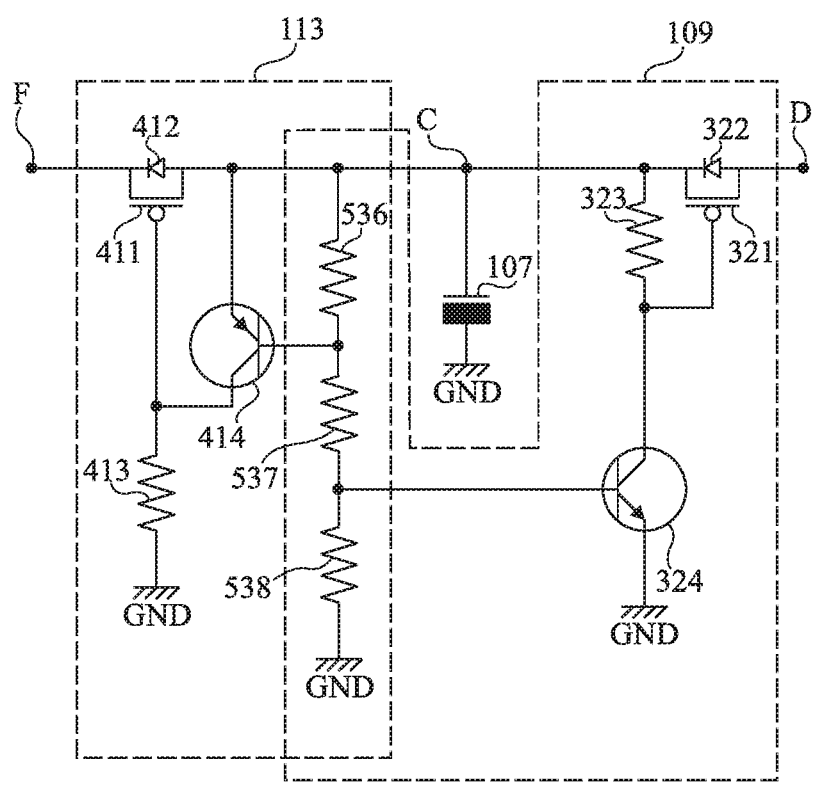
FIG. 6 is an electric diagram illustrating another embodiment of the circuit of protection against an overcharge and of the circuit of protection against an over-discharge described in relation with FIG. 3.

FIG. 6 is an electric diagram illustrating another embodiment of circuit 113 of protection against an overcharge and of circuit 109 of protection against an over-discharge described in relation with FIG. 3. FIG. 6 only shows circuits 113 and 109 and battery 107.

The embodiment of FIG. 6 differs from the embodiment of FIG. 5 mainly in that, in the example of FIG. 6, transistors 311 and 314, diode 312 and resistor 313 of circuit 113 are replaced with transistors 411 and 414, diode 412, and resistor 413 of circuit 113 of FIG. 4, substantially arranged in the same way as in the example of FIG. 4. In the example of FIG. 6, the base of transistor 324 is connected to the junction point of resistors 537 and 538, and the base of transistor 414 is connected to the junction point of resistors 536 and 537.

Figure 7:
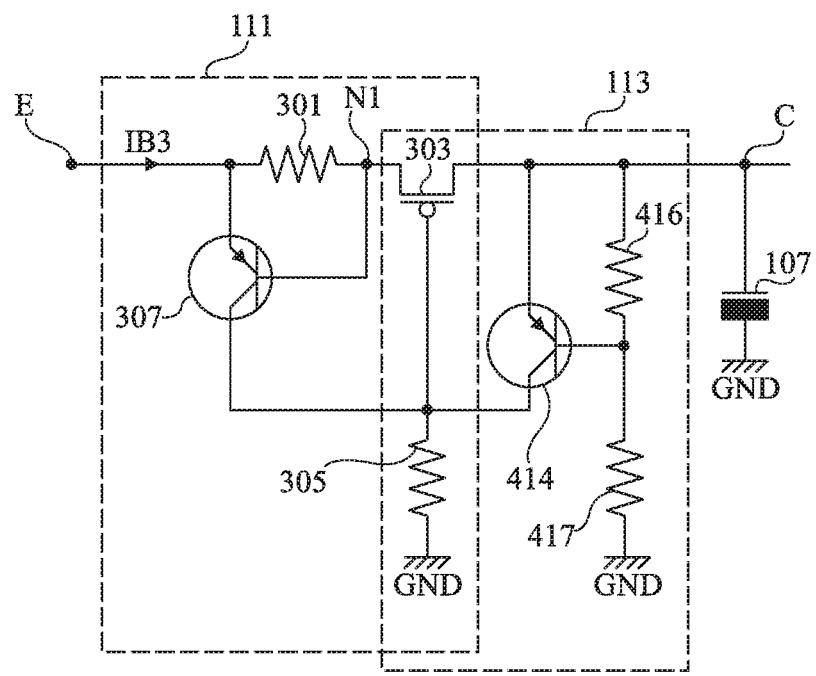
FIG. 7 is an electric diagram illustrating another embodiment of the current-limiting circuit and of the circuit of protection against an overcharge described in relation with FIG. 3.

FIG. 7 is an electric diagram illustrating another embodiment of current-limiting circuit 111 and of circuit 113 of protection against an overcharge described in relation with FIG. 3. In FIG. 7, only circuits 111 and 113 and battery 107 have been shown.

In the example of FIG. 7, circuit 111 is identical to circuit 111 of FIG. 3, and circuit 113 is similar to circuit 113 of FIG. 4 but shares elements with circuit 111. More particularly, in the example of FIG. 7, circuits 111 and 113 share a same MOS transistor and a same resistor coupling the gate of the MOS transistor to node GND. In other words, in the example of FIG. 7, transistor 411, diode 412 and resistor 413 of circuit 113 of FIG. 4 are omitted. Further, nodes F and C are confounded, that is, transistor 303 directly couples node N1 to node C. Transistor 414 has its conduction nodes respectively coupled to node C and to the gate of transistor 303. As in the example of FIG. 4, circuit 113 comprises a resistive dividing bridge comprising two resistors 416 and 417 in series between node C and node GND, the junction point between resistors 416 and 417 being coupled to the base of transistor 414.

Here again, the mutualization of the components provides a gain in terms of cost, bulk, and electric power consumption.

Figure 8:
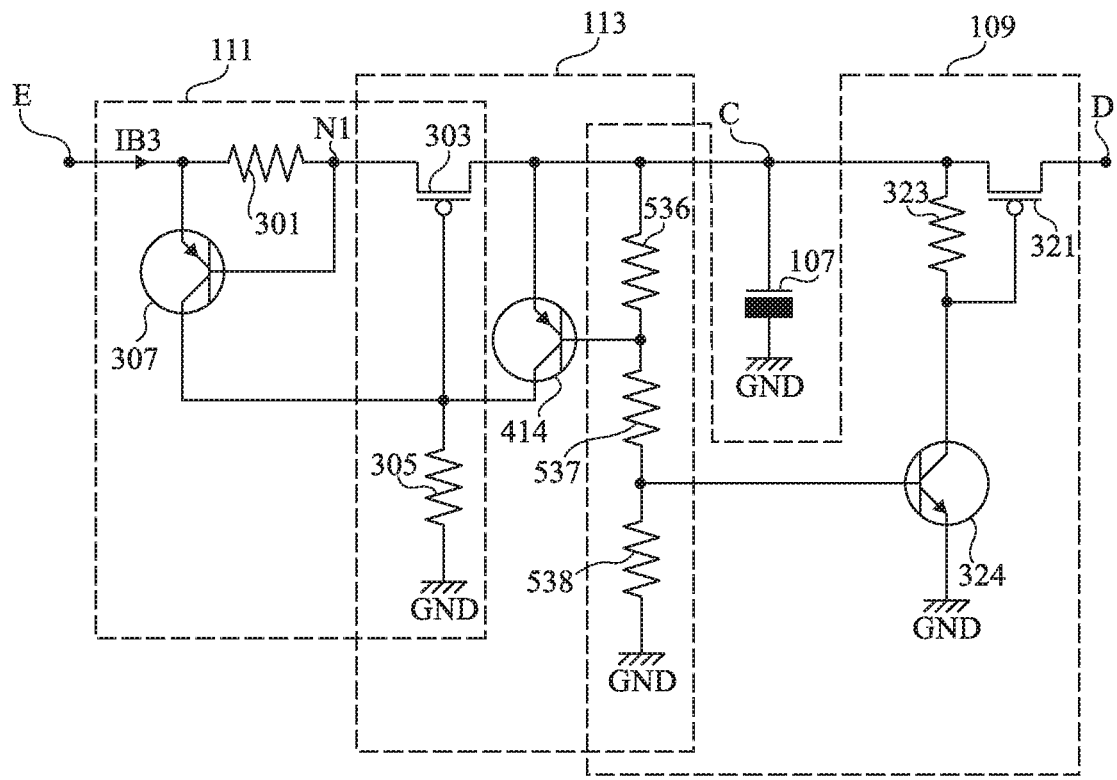
FIG. 8 is an electric diagram illustrating another example of the current-limiting circuit, of the circuit of protection against an overcharge, and of the circuit of protection against an over-discharge described in relation with FIG. 3.

FIG. 8 is an electric diagram illustrating another embodiment of current-limiting circuit 111, of circuit 113 of protection against an overcharge, and of circuit 109 of protection against an over-discharge described in relation with FIG. 3. In the example of FIG. 8, and still to minimize the cost, the bulk, and the electric power consumption of the unit, circuits 111 and 113 on the one hand, and 113 and 109 on the other hand, share common elements. In FIG. 8, only circuits 111, 113, and 109 and battery 107 have been shown.

In the example of FIG. 8, circuits 111 and 113 are formed similarly to what has been described in the example of FIG. 7, to share a single MOS transistor 303 between node N1 and node C. Further, circuits 113 and 109 are formed similarly to what has been described in the example of FIG. 6 to share a single two-output resistive dividing bridge. In other words, in the example of FIG. 8, the forming of circuits 111 and 113 differs from what has been described in relation with FIG. 7 only in that the single-output resistive dividing bridge formed by resistors 416 and 417 in the example of FIG. 7 has been replaced with the two-output resistive dividing bridge of the example of FIG. 6, formed by resistors 536, 537, and 538, the junction point of resistors 536 and 537 being connected to the base of transistor 414. Circuit 109 of FIG. 8 is identical to circuit 109 of FIG. 6.

Specific embodiments have been described. Various alterations and modifications will occur to those skilled in the art. In particular, the described embodiments are not limited to the specific embodiments of circuits 111, 113, 109, and 117 described in relation with FIGS. 2 to 8. More generally, it will be within the abilities of those skilled in the art to provide other circuits capable of implementing the desired functions. It should in particular be noted that current-limiting circuit 111 of the measurement unit may be formed of a simple fixed resistor coupling node E to node F.

Further, and although this has not been shown in the drawings, measurement unit 100 of FIG. 1 may further comprise a power supply circuit intended to be coupled to an electric power supply source external to the unit, to enable to power the unit independently from the power level of the ambient energy source during specific maintenance or test operations. As an example, the power supply circuit is connected on the one hand to node E and on the other hand to node G, and is capable of applying power supply voltages to nodes E and G, for example, to recharge battery 107 if it is totally discharged and/or to power active circuit 115 for test purposes. The power supply circuit may comprise an interface for the coupling to an external electric energy source, for example, a wire interface, for example, of USB type, or an inductive coupling interface.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A measurement unit comprising:
   an electric ambient energy recovery generator;
   an element of capacitive storage of the electric energy generated by the generator;
   an electric battery;
   a first branch coupling an output node of the generator to a first electrode of the capacitive storage element;
   a second branch coupling a first terminal of the battery to the first electrode of the capacitive storage element; and
   an active circuit capable of transmitting a radio event indicator signal each time the voltage across the capacitive storage element exceeds a first threshold,
   wherein, in operation, the capacitive storage element simultaneously receives, on its first electrode, a first charge current originating from the generator via the first branch, and a second charge current originating from the battery via the second branch.

2. The unit of claim 1, wherein the first branch comprises a first resistor and the second branch comprises a second resistor.

3. The unit of claim 1, wherein the second branch comprises a circuit for protecting the battery against an over-discharge.

4. The unit of claim 3, wherein the circuit for protecting the battery against an over-discharge comprises a transistor coupling the first terminal of the battery to the first electrode of the capacitive storage element, and a circuit capable of controlling this transistor to the on state when the voltage across the battery is higher than a low limit below which the battery would risk being damaged, and to the off state when the voltage across the battery is lower than said low limit.

5. The unit of claim 1, wherein the first branch comprises a diode oriented in the forward direction between the output node of the generator and the first electrode of the capacitive storage element.

6. The unit of claim 1, wherein the second branch comprises a diode oriented in the forward direction between the first terminal of the battery and the first electrode of the capacitive storage element.

7. The unit of claim 1, further comprising a third branch coupling the output node of the generator to the first terminal of the battery.

8. The unit of claim 7, wherein the third branch comprises a circuit for protecting the battery against an overcharge.

9. The unit of claim 8, wherein the circuit for protecting the battery against an overcharge comprises a transistor coupling the output node of the generator to the first terminal of the battery and a circuit capable of controlling this transistor to the on state when the voltage across the battery is lower than an upper limit above which the battery would risk being damaged, and to the off state when the voltage across the battery is higher than said upper limit.

10. The unit of claim 7, wherein the third branch further comprises a circuit for limiting the charge current applied to the battery.

11. The unit of claim 10, wherein the current-limiting circuit comprises a transistor and a circuit capable of controlling this transistor in linear state so that the resistance of the transistor is all the higher as the current applied by the generator in the third branch is high.

12. The unit of claim 7, wherein the third branch further comprises a diode oriented in the forward direction between the output node of the generator and the first terminal of the battery.

13. The unit of claim 1, wherein the active circuit has a power supply node coupled to the first electrode of the capacitive storage element via a switch, and wherein the unit comprises a control circuit capable of controlling the switch to the on state when the voltage across the capacitive element exceeds said first threshold.

14. The unit of claim 13, wherein the control circuit is further capable of controlling the switch back to the off state when the voltage across the capacitive element falls below a second threshold lower than the first threshold.

15. A system comprising one or a plurality of measurement units of claim 1, and a data collection unit capable of receiving the event indicator signals transmitted by each unit, and of measuring a time quantity representative of the frequency of transmission of the event indicator signals by each unit.

* * * * *